(12) United States Patent
Koblmueller et al.

(10) Patent No.: US 10,511,151 B2
(45) Date of Patent: Dec. 17, 2019

(54) METHOD FOR FABRICATING A NANOSTRUCTURE

(71) Applicant: Technische Universitaet Muenchen, Munich (DE)

(72) Inventors: Gregor Koblmueller, Regensburg (DE); Benedikt Mayer, Munich (DE); Jonathan Finley, Aschheim (DE); Gerhard Abstreiter, Hallbergmoos (DE)

(73) Assignee: Technische Universitaet Muenchen, Munich (DE)

( * ) Notice: Subject to any disclaimer, the term of this patent is extended or adjusted under 35 U.S.C. 154(b) by 0 days.

(21) Appl. No.: 15/759,986

(22) PCT Filed: Sep. 14, 2016

(86) PCT No.: PCT/EP2016/071672
§ 371 (c)(1),
(2) Date: Mar. 14, 2018

(87) PCT Pub. No.: WO2017/046151
PCT Pub. Date: Mar. 23, 2017

(65) Prior Publication Data
US 2018/0269657 A1   Sep. 20, 2018

(30) Foreign Application Priority Data
Sep. 15, 2015   (EP) .................................... 15185295

(51) Int. Cl.
*H01L 21/00*   (2006.01)
*H01S 5/34*   (2006.01)
(Continued)

(52) U.S. Cl.
CPC .............. *H01S 5/341* (2013.01); *B82Y 10/00* (2013.01); *H01L 21/02546* (2013.01);
(Continued)

(58) Field of Classification Search
CPC ........ H01S 5/341; H01S 5/0218; H01S 5/343; H01S 5/021; H01S 5/1042; H01S 5/4025;
(Continued)

(56) References Cited

U.S. PATENT DOCUMENTS 7,163,659 B2 *   1/2007   Stasiak .............. G01N 27/3278
422/68.1
7,355,216 B2 *   4/2008   Yang ...................... B82Y 10/00
257/200

(Continued)

OTHER PUBLICATIONS

International Search Report and Written Opinion dated Nov. 9, 2016 in related application PCT/EP2016/071672 filed Sep. 14, 2016.
(Continued)

*Primary Examiner* — Vu A Vu
(74) *Attorney, Agent, or Firm* — Steven J. Grossman; Grossman, Tucker, Perreault & Pfleger PLLC

(57) ABSTRACT

A method for fabricating a nanostructure comprises the steps of growing a first nanowire on a substrate, forming a dielectric layer on the substrate, the dielectric layer surrounding the first nanowire, wherein a thickness of the dielectric layer is smaller than a length of the first nanowire, and removing the first nanowire from the dielectric layer, thereby exposing an aperture in the dielectric layer.

20 Claims, 3 Drawing Sheets

(51) Int. Cl.
| | |
|---|---|
| B82Y 10/00 | (2011.01) |
| H01L 21/02 | (2006.01) |
| H01S 5/40 | (2006.01) |
| H01S 5/02 | (2006.01) |
| H01S 5/10 | (2006.01) |
| H01S 5/343 | (2006.01) |
| H01L 33/18 | (2010.01) |
| B82Y 40/00 | (2011.01) |

(52) U.S. Cl.
CPC .. *H01L 21/02603* (2013.01); *H01L 21/02631* (2013.01); *H01L 21/02639* (2013.01); *H01S 5/021* (2013.01); *H01S 5/0218* (2013.01); *H01S 5/1042* (2013.01); *H01S 5/343* (2013.01); *H01S 5/4025* (2013.01); *B82Y 40/00* (2013.01); *H01L 33/18* (2013.01); *H01S 2304/00* (2013.01); *H01S 2304/02* (2013.01); *H01S 2304/04* (2013.01)

(58) Field of Classification Search
CPC ............ H01S 2304/02; H01S 2304/04; H01S 2304/00; H01L 21/02546; H01L 21/02639; H01L 21/02631; H01L 21/02603; H01L 33/18; B82Y 10/00; B82Y 40/00

USPC ........................................................ 438/41
See application file for complete search history.

(56) References Cited

U.S. PATENT DOCUMENTS

| | | | |
|---|---|---|---|
| 7,608,905 B2* | 10/2009 | Bratkovski | H01Q 15/0006 257/419 |
| 8,410,496 B2* | 4/2013 | Hersee | B82Y 20/00 257/91 |
| 2008/0110486 A1 | 5/2008 | Tsakalakos et al. | |
| 2011/0139209 A1 | 6/2011 | Lang et al. | |

OTHER PUBLICATIONS

Noborisaka, J., et al., "Fabrication and characterization of freestanding GaAs/AlGaAs core-shell nanowires and AlGaAs nanotubes by using selective-area metalorganic vapor phase epitaxy", Applied Physics Letters, Aug. 24, 2005, pp. 87, 093109-1 through 093109-3, vol. 87, No. 9. (Cited as a Y in the ISR dated Nov. 9, 2016).

Noborisaka, J., et al., "Catalyst-free growth of GaAs nanowires by selective-area metalorganic vapor-phase epitaxy", Applied Physics Letters, May 16, 2005, pp. 86,213102-1 through 213102-3, vol. 86, No. 21. (Cited as a Y in the ISR dated Nov. 9, 2016).

* cited by examiner

METHOD FOR FABRICATING A NANOSTRUCTURE

FIELD OF THE INVENTION

The present disclosure relates to a method for fabricating a nanostructure, in particular a nanowire laser structure.

BACKGROUND

Nanostructures, in particular nanowires, have recently obtained a lot of attention and may play a significant role in the miniaturization and improvement of novel electronic and computing devices. As an example, semiconductor III-V nanowires provide a significant potential to create a new generation of lasers and on-chip coherent light sources due to their ability to operate as single mode optical waveguides, resonantly recirculate optical fields and provide gain.

However, the manufacturing of nanostructures, such as nanowires on semiconductor substrates is challenging due to their small dimensions and the high degree of accuracy that is needed to meet the often very narrow parameter specifications. Many nanostructure applications require the fabrication of apertures with a dimension in the range of 100 nm or significantly less in thick dielectric layers. Sometimes, a large array of such apertures with carefully defined dimensions and at precisely defined positions need to be fabricated on a semiconductor substrate. The challenges in fabricating such aperture patterns result mainly from the selection of proper resist layers with high selectivity in pattern transfer during etching processes. There are not many appropriate resist layers that withstand etching of very deep apertures, and the resist is oftentimes more easily etched than the desired dielectric layer underneath. There is a need for a manufacturing technique that allows to manufacture ultra-thin aperturers in thick dielectric layers easily and swiftly and with a high degree of accuracy.

SUMMARY OF THE INVENTION

This objective is achieved with the method for fabricating a nanostructure according to independent claim 1. The dependent claims relate to preferred embodiments.

A method for fabricating a nanostructure according to the invention comprises the steps of growing a first nanowire on a substrate, forming a dielectric layer on said substrate, said dielectric layer surrounding said first nanowire, wherein a thickness of said dielectric layer is smaller than a length of said first nanowire, and removing said first nanowire from said dielectric layer, thereby exposing a aperture in said dielectric layer.

The inventors found that apertures with carefully defined dimensions can be formed by means of a sacrificial nanowire growth technique in which the positions of the apertures and their dimensions are defined in terms of sacrificial nanowires that are later removed from the substrate. Rather than first forming a dielectric layer and then forming apertures in the dielectric layer, the method according to the invention first defines the positions and dimensions of the desired apertures in terms of the sacrificial nanowires, and then grows the dielectric layer around the nanowires defining the apertures. The method according to the invention hence turns around the conventional techniques for forming aperture patterns in a dielectric layer.

The invention allows the formation of apertures of a large variety of dimensions and shapes. In particular, the apertures may comprise holes, such as cylindrical holes, but may also comprise elongated trenches.

Given that the positions and dimensions of the nanowire growth on the substrate can be carefully defined, the method according to the present invention allows to fabricate an aperture pattern with a high degree of accuracy. The invention is particularly advantageous in the formation of very thin holes in thick dielectric layers, which are difficult to manufacture with conventional semiconductor fabrication techniques.

In particular, the method according to the present invention may allow the fabrication of apertures of a diameter d in a dielectric layer of a thickness t, wherein t/d is larger than 2, preferably larger than 3, and in particular larger than 5. In some instances, the ratio t/d may amount to 10 or even higher.

However, the invention is not limited to apertures found from a single nanowire. Rather, a plurality of first nanowires may be grown on the substrate, and said dielectric layer may be formed on said substrate to surround said plurality of first nanowires, wherein a thickness of said dielectric layer is smaller than a length of said plurality of first nanowires. Said first nanowires may then be removed from said dielectric layer, and may together expose an aperture in said dielectric layer.

In this configuration, the size and dimensions of the aperture correspond to said plurality of first nanowires, rather than to a single nanowire. For instance, a plurality of first nanowires may be grown on said substrate in close spatial proximity, so that they merge on said substrate into a common nanowire structure, such as a nanowire wall. Once the plurality of first nanowires are removed from the substrate, they may expose an aperture in said dielectric layer in the form of an elongated trench.

In a preferred embodiment, said first nanowire is grown from a seed positioned on said substrate.

The inventors found that the use of seeds is particularly useful to foster the growth of the first nanowires on the substrate, and hence speed up the fabrication process.

In an example, growing said first nanowire comprises the steps of forming a mask layer on said substrate, forming an opening in said mask layer, wherein said opening extends to said substrate, and growing said first nanowire on said substrate in said opening.

By means of the mask layer, the positions at which the sacrificial nanowires (and hence the apertures) are formed on the substrate can be selected with high precision, thereby further enhancing the spatial accuracy of the fabrication technique. In particular, semi-conductor lithography techniques may be employed in the forming of the mask layer, and can achieve a high position accuracy in the nanometer range.

Said mask layer may be formed at a thickness no larger than 80 nm, and preferably no larger than 50 nm.

A thin mask layer can be formed on the substrate swiftly and without sophisticated fabrication techniques and can be etched easily by standard fabrication techniques, but is still sufficient to define the positions at which the sacrificial nanowires grow on the substrate with high precision, and to support the growth of the sacrificial nanowires in these positions. It can often be provided naturally by oxidation of the top few nanometers of semiconductor material exposed to air such as $Si/SiO_2$.

Said mask layer may comprise a dielectric, in particular $SiO_2$.

The inventors found that a dielectric mask layer allows to define the positions at which the sacrificial nanowires grow on the substrate with a high degree of precision. Moreover, the dielectric mask layer can conveniently be integrated into the dielectric layer formed on the substrate in a subsequent processing step.

Said dielectric layer and/or said dielectric mask layer may be formed by means of sputtering and/or chemical vapor deposition and/or atomic layer deposition and/or molecular beam epitaxy.

In particular, said dielectric layer may be formed on said substrate at a thickness of at least 100 nm, preferably at least 150 nm, and in particular at least 200 nm.

In an example, the nanostructure to be fabricated may be adapted to emit a laser signal at a wavelength $\lambda$, and hence the dimensions of the nanostructure, and the dielectric layer in particular, may be tailored to the wavelength $\lambda$. In particular, its dimensions may be conveniently expressed in term's of the wavelength $\lambda$. The thickness of said dielectric layer may be chosen as an integer multiple of $\lambda/(2\,n)$, wherein n denotes an index of refraction of said dielectric layer.

Said first nanowire may be removed from said dielectric layer and/or said substrate by means of a thermal decomposition and/or by means of a selective etching, in particular wet chemical etching and/or dry chemical etching.

Once the ultrathin apertures of the nanoscale dimensions have been formed, they can subsequently be employed in the formation of other nanostructures. For instance, they may be employed as an aperture pattern for growing an array of nanowires on the substrate.

Hence, said method may further comprise a step of growing a second nanowire in said aperture on said substrate.

In particular, said second nanowire may be grown to extend beyond said dielectric layer.

Hence, a height of said second nanowire may be greater than the thickness of said dielectric layer.

Growing said second nanowire may comprise a step of growing a support element in said aperture, and extending said support element above said dielectric layer, and growing a body element around at least a portion of said support element that extends above said dielectric layer. The resulting nanowire structures may have a funnel-like structure with a thin support element or core that is surrounded in a portion above the dielectric layer by a wider shell.

Said support element may be grown by means of axial growth.

Said body element may be grown by means of radial growth.

Nanowire structures or nanowire arrays of this type can be employed as a monolithically integrated nanowire laser with superior optical properties.

In particular, a diameter of said body element may be at least two times larger than a diameter of said support element, and preferably at least three times larger than a diameter of said support element.

In an example, said nanostructure may be adapted to emit a laser signal at a wavelength $\lambda$, and a diameter of said support element may be smaller than $\lambda/(2\,n)$, wherein n denotes an index of refraction of said support element.

Moreover, a diameter of said body element may be no smaller than $\lambda/n$, in particular no smaller than $1.5\lambda/n$, wherein n denotes an index of refraction of said body element.

Growing said first nanowire and/or growing said second nanowire may comprise molecular beam epitaxy or metal organic chemical vapor deposition or chemical beam epitaxy or laser ablation or magnetron sputtering.

The dimension and orientation of the aperture may be carefully selected by choosing the growth parameters accordingly so as to grow a first nanowire with corresponding size and orientation.

For instance, said first nanowire and/or said second nanowire may be grown in a direction perpendicular to an upper surface of said substrate.

Alternatively, said first nanowire and/or said second nanowire may be grown at an angle inclined to a surface normal of said substrate. Preferably, said angle is at least 20 degrees, and in particular at least 70 degrees.

DESCRIPTION OF EMBODIMENTS

The features and advantages of the method for fabricating a nanostructure according to the present invention will become best apparent from a detailed description of exemplary embodiments in conjunction with the accompanying drawings, in which.

Figure 1:
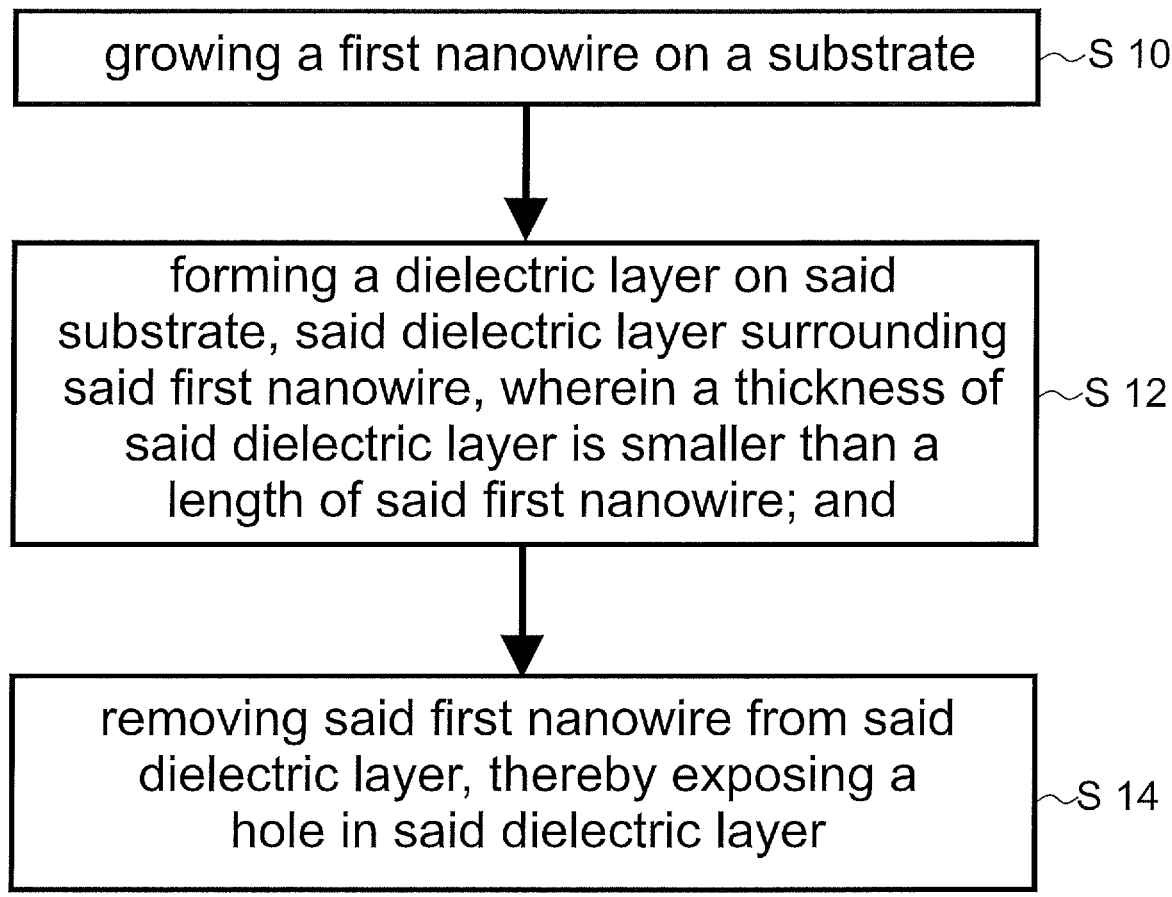
FIG. 1 is a flow diagram illustrating a method for fabricating a nanostructure according to an example.

With reference to the flow diagram of FIG. 1, in a first step S10, a first nanowire is grown on a substrate. In a subsequent step S12, a dielectric layer is formed on said substrate, said dielectric layer surrounding said first nanowire, wherein the thickness of said dielectric layer is smaller than the length of said first nanowire. In a third step S14, said first nanowire is removed from said dielectric layer, thereby exposing a aperture in said dielectric layer.

A method for fabricating a nanostructure will now be described with reference to FIGS. 2 to 3 for the specific example of fabricating a nanowire laser array. However, the invention is not so limited, and is generally applicable whenever an aperture with a diameter in the nanometer range shall be formed in a dielectric layer, in particular in a dielectric layer that is much thicker than the diameter of the apertures to be formed.

FIGS. 2a to 2f are schematic cross-sectional drawings that illustrate a sequence of steps for fainting an aperture pattern 10 with a plurality of apertures in a dielectric layer 14. FIG. 2 shows a method for forming four apertures $12_1$ to $12_4$ in the dielectric layer 14. However, the invention is not so limited, and may just as well be employed for the formation of a single aperture or a large number of apertures in the dielectric layer 14. In fact, it is a particular advantage of the method according to the present invention that it allows the formation of arrays comprising thousands or even millions of apertures at carefully selected positions and with accurately controlled dimensions by employing semiconductor fabrication techniques.

As illustrated in FIG. 2a, a thin dielectric mask layer 16 may be formed on a substrate layer, such as a silicon substrate 18, by means of e-beam lithography or nano imprint lithography. For instance, the dielectric mask layer 16 may comprise $SiO_2$ at a thickness in the range of 5 to 30 nm. As further illustrated in FIG. 2a, a patterned resist layer 20 with apertures 22 may be formed on the dielectric mask layer 16. For instance, the resist layer 20 may comprise PMMA.

Subsequent reactive ion etching (RIE) and/or hydrofluoric acid (HF) etching may then be employed to extend the apertures 22 down through the dielectric mask layer 16 and to the upper surface of the silicon substrate 18. The resulting structure (after removal of the resist layer 20) is shown in FIG. 2b.

As illustrated in FIG. 2c, sacrificial nanowire structures 24 are then grown in the apertures 22 in the vertical direction. These sacrificial nanowire structures 24 only need to be as high as a few hundred nanometers, and in particular just as high as the desired thickness of the dielectric layer 14. The sacrificial nanowire structures 24 may be grown to a maximum diameter of approximately 200 nm, and are preferably composed of a material that can be easily etched by wet chemistry or decomposed thermally at temperatures below the respective decomposition/dissolution temperature of the desired dielectric layer 14. For instance, the sacrificial nanowire structures 24 may be formed of a combination of group III/group V semiconductor material, such as InAs, InGaAs, or GaAs.

These nanowires can be thermally evaporated under both ambient and vacuum conditions at temperatures of 400 to 800° C., and hence well below the onset for subliming $SiO_2$ at 1000° C. The resulting structure comprising the sacrificial nanowires 24 is show in FIG. 2c.

Once the sacrificial nanowire structures 24 have been grown, in a subsequent step a thick dielectric layer deposit 26 may be grown on the dielectric mask layer 16 and the sacrificial nanowire structures 24, as schematically illustrated in FIG. 2d. Growth of the dielectric layer deposit 26 may involve techniques such as sputtering, plasma-enhanced chemical vapor deposition (PECVD), atomic layer deposition (ALD) or epitaxial techniques such as molecular beam epitaxy (MBE) or metal-organic chemical vapor deposition (MOCVD). For instance, the dielectric layer deposit 24 may comprise $SiO_2$ or SiN at a thickness of 200 nm or higher. The use of epitaxial techniques such as MBE and/or MOCVD also allows to form a dielectric layer 26 comprising a distributed Bragg reflector and/or a high contrast grating, which may be beneficial for some laser applications.

As schematically shown in FIG. 2d, the sacrificial nanowire structures 24 may be parasitically covered by the dielectric layer deposit 26 on all their facets. In order to minimize the parasitic deposits on the side walls of the sacrificial nanowire structure 24 that protrude above the desired dielectric layer 14, the inventors found it advantageous to employ highly directional sputtering techniques for forming the dielectric layer deposit 26, rather than more homogeneous techniques such as atomic layer deposition. This is because sputtering from a target under near normal incidence will usually result in a more anisotropic growth of the parasitic dielectric, with substantial dielectric layer material 26 on the top facet of the sacrificial nanowire structures 24, but only relatively thin layers of dielectric material on the side facets, as schematically shown in FIG. 2d. In contrast, atomic layer deposition usually results in a more isotropic growth with parasitic dielectric layer deposit 26 uniformly distributed all around the sacrificial nanowire structures 24.

In a subsequent step, the parasitic deposits of the dielectric layer deposit 26 on the sacrificial nanowire structures 24 may be etched, such as by employing buffered hydrofluoric acid (HF). The inventors found that dipping the sample very shortly into the buffered HF solution is sufficient to remove the thin parasitic layer of the dielectric layer deposit 26 from the sacrificial nanowire structures 24. The resulting sample is shown in FIG. 2e. The dielectric layer that remains on the substrate 18 corresponds to the dielectric layer 14 at the desired thickness.

The sample may now be transferred to an annealing device capable of providing temperatures in the range of approximately 800° C. At these temperatures, the sacrificial nanowire structures 24 dissolve thermally. For instance, thermal decomposition of GaAs sacrificial nanowires 80 in high vacuum of $10^{-6}$ to $10^{-9}$ Torr requires annealing temperatures in the range of 650 to 750° C. The inventors found it helpful to monitor the evaporating species during the annealing procedure, such as by mass spectrometry in situ. The annealing process can be considered completed once no more measurable traces of the evaporating species are detected in the mass spectrometer. This allows the determination of the time duration of the annealing procedure.

The annealing step leaves behind the configuration shown in FIG. 2f, with thin nano-apertures $12_1$ to $12_4$ whose shapes and diameters corresponds to the diameters of the (removed) sacrificial nanowire structures 24 and that extend through the entire dielectric layer 14 down to the substrate 18.

By means of the technique described above with reference to FIGS. 2a to 2f, thin nano-apertures $12_1$ to $12_4$ with diameters in the range of 100 nm or less may be formed in a dielectric layer 14 at a thickness of 200 nm or even more.

The aperture pattern 10 illustrated in FIG. 2f can be used in a large variety of nanostructure fabrication techniques that require thin apertures $12_1$ to $12_4$ with carefully defined positions and sizes. For instance, FIG. 3 illustrates the growth of a nanowire laser array 28 in the aperture pattern 10.

In the sequel, a growth process for a nanowire layer array 28 comprising a plurality of nanowire laser structures $30_1$ to $30_4$ made from group III/group V semiconductors is described, but one skilled in the art will understand that similar techniques may be employed to fabricate nanowire laser structures from other semiconductor materials. In a self-catalyzed growth process, the group-III element may form a metallic droplet seed inside the apertures $12_1$ to $12_4$ during the nucleation step. This seed droplet can comprise Ga or In, depending on whether GaAs or InGaAs-based nanowire lasers are desired. The growth temperature can be chosen so as to promote formation of the metal droplet only inside the apertures $12_1$ to $12_4$, and not on the dielectric $SiO_2$ layer 14. Good growth selectivity can be achieved by using high substrate temperatures in the range of 500° C. and beyond.

A support element of the nanowire may first be grown to a length of 1 µm or larger, such as 5 to 20 µm, to define the length of the nanowire laser cavity. In this case, a typical diameter of the support element may be in the range of approximately 20 to 150 nm, depending on the growth conditions, such as III-V flux/pressure and temperature. This diameter range is typically insufficient to allow for an effective mode confinement. However, after growth of the inner nanowire support element, the growth process may be changed from axial to lateral growth, so as to widen the nanowire structure and thereby form a body element surrounding the support element above the dielectric layer. This may be achieved by lowering the growth temperature to exploit the facet-dependent growth rate differences and induce radial growth along the {110} or {112} stable planes of compound semiconductor nanowires. Depending on the desired optical confinement of the fundamental optical modes, the radial growth may result in a diameter of the body element in the range of 200 nm or larger, for instance 300 to 600 nm for GaAs and InGaAs-based nanowires.

During this radial growth step, the group-V pressure/flux may be increased so that growth takes place under group-V rich conditions. This has the additional benefit that the V-rich growth environment consumes the self-catalyzed metal droplet at the nanowire growth front, and therefore leads to a specular mirror-like end facet.

The result is a nanowire laser array 28 with a plurality of nanowire laser structures $30_1$ to $30_4$ in which the respective body elements extend laterally only above the $SiO_2$ dielectric layer 14, with a funnel-like support element at the base that connects the respective body element to the underlying substrate 18.

Figure 3:
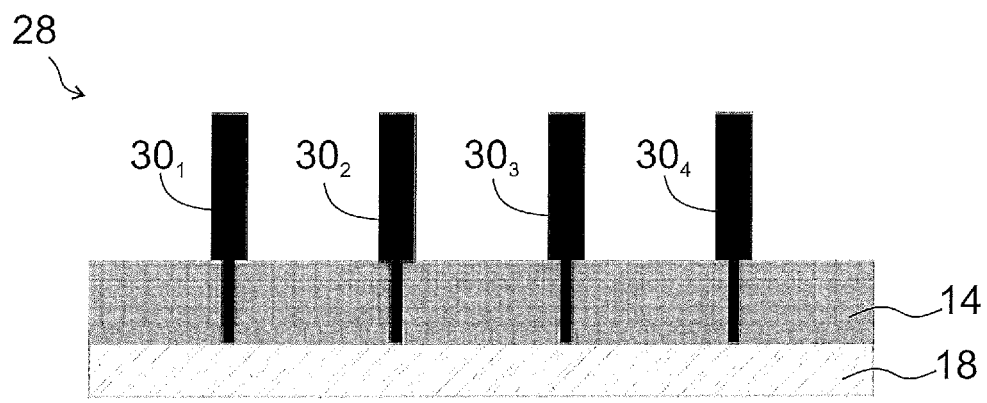
FIG. 3 illustrates the subsequent growth of a nanowire array in the aperture pattern formed according to the example method of FIGS. 2a to 2f.

An example for a nanowire laser structure $30_1$ to $30_4$ (henceforth denoted by reference numeral 30) as shown in FIG. 3 will now be described in greater detail with reference to FIG. 4.

The nanowire laser structure 30 comprises the substrate 18, the elongated body element 32 (shown in black) resulting from the axial growth and extending vertically from the silicone substrate 18, and the elongated body element 34 (shown hatched in FIG. 4) that results from the subsequent lateral growth and is formed on and around the support element 32.

Figure 4:
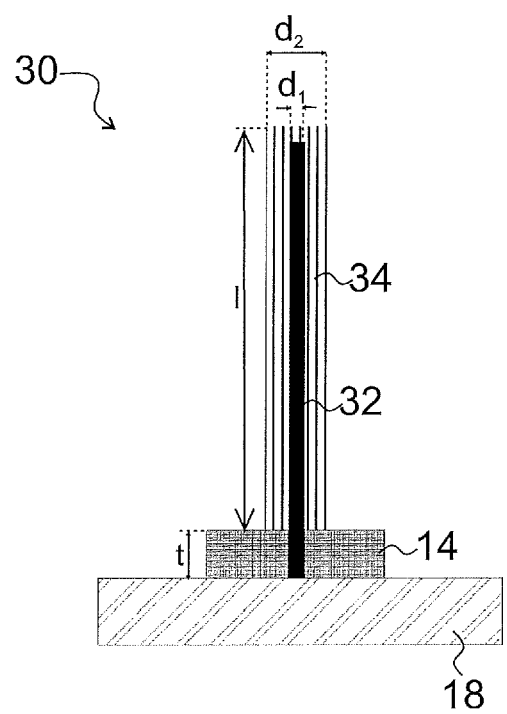
FIG. 4 is a schematic cross-sectional view that shows one of the nanowires of FIG. 3 in additional detail.

In the configuration of FIG. 4, the support element 32 extends through the body element 34, and hence serves as a core of the nanowire laser structure 30. The body element 34 extends around the support element 32, and hence can be considered a shell of the nanowire laser structure 30.

Contrary to the support element 32, the body element 34 does not extend all the way down to the substrate 18, but is separated from the substrate 18 by means of the dielectric layer 14 that surrounds the lower part of the support element 32 and extends between an upper surface of the substrate 18 and a lower surface of the body element 34.

The dimensions of the nanowire laser structure 30 are chosen in accordance with the laser wavelength of the laser signal that the nanowire laser structure 30 is supposed to emit. For instance, a diameter $d_1$ of the support element 32 may be chosen smaller than $\lambda/(2 \cdot n)$, when n denotes an index of refraction of the support element 32. A diameter $d_1 < \lambda/(2 \cdot n)$ prevents laser wavelengths from forming and resonating within the support element 32, and hence prevents direct contact or coupling of these laser wavelengths with the underlying substrate 18 on which the support element 32 is formed.

An outer diameter $d_2$ of the body element 34 may be at least two times larger than the diameter $d_1$ of the support element 32, and in particular may amount to at least $\lambda/n$, wherein n denotes an index of refraction of the body element 32. Hence, laser wavelengths may form and resonate in the body element 34. The body element 34 thus serves as a laser cavity.

Depending on the laser wavelength, the diameter $d_1$ of the support element 32 may be in the range between 80 nm and 300 nm. Correspondingly, the diameter $d_2$ of the body element 34 may amount to at least 160 nm, in particular at least 400 nm or at least 600 nm.

The dielectric layer 14 serves to reflect the laser modes at the lower end of the body element 34, and therefore provides resonant recirculation of the optical modes for lasing of the nanowire structure 30. The inventors found that the dielectric layer 14 enhances the modal reflectivity at the nanowire interface to 0.9 or even beyond, two to three orders of magnitude higher than what could be obtained by reflecting the laser modes directly off the silicon substrate 18. Even though the nanowire structure 30 is anchored directly to the silicon substrate 14 via the support element 32, it hence maintains excellent wave-guiding properties with confinement factors larger than 90% and spontaneous emission factors of $\beta=0.2$ due to the low order mode laser cavity formed by the body element 34 being separated from the substrate 18 by means of the dielectric layer 14.

Preferably, a thickness t of the dielectric layer 14 may be chosen as an integer multiple of $\lambda/(2 \cdot n)$, wherein n denotes an index of refraction of the dielectric layer 14. This thickness allows reflection both on a upper surface side of the dielectric layer 14 at the interface with the body element 34 and on a lower surface side of the dielectric layer 14 at the interface with the underlying substrate 18, and thereby further enhances the reflective properties by exploiting constructive interference of light reflections from said interfaces 34/14 and 14/18 inside said body element 34.

Depending on the desired laser wavelength, the thickness t of the dielectric layer 14 may be chosen in the range between 100 nm and 800 nm.

A length l of the body element 34 may amount to at least 1 μm. With a cavity length of at least 1 μm, the inventors found that losses may be efficiently suppressed. If the reflectivity of the dielectric layer 14 is particularly good, even shorter body elements may be used.

For some applications, the support element 32 and/or the body element 34 may be doped individually. The doping may be homogeneous. Alternatively, graded dopings may be employed.

Figure 2:
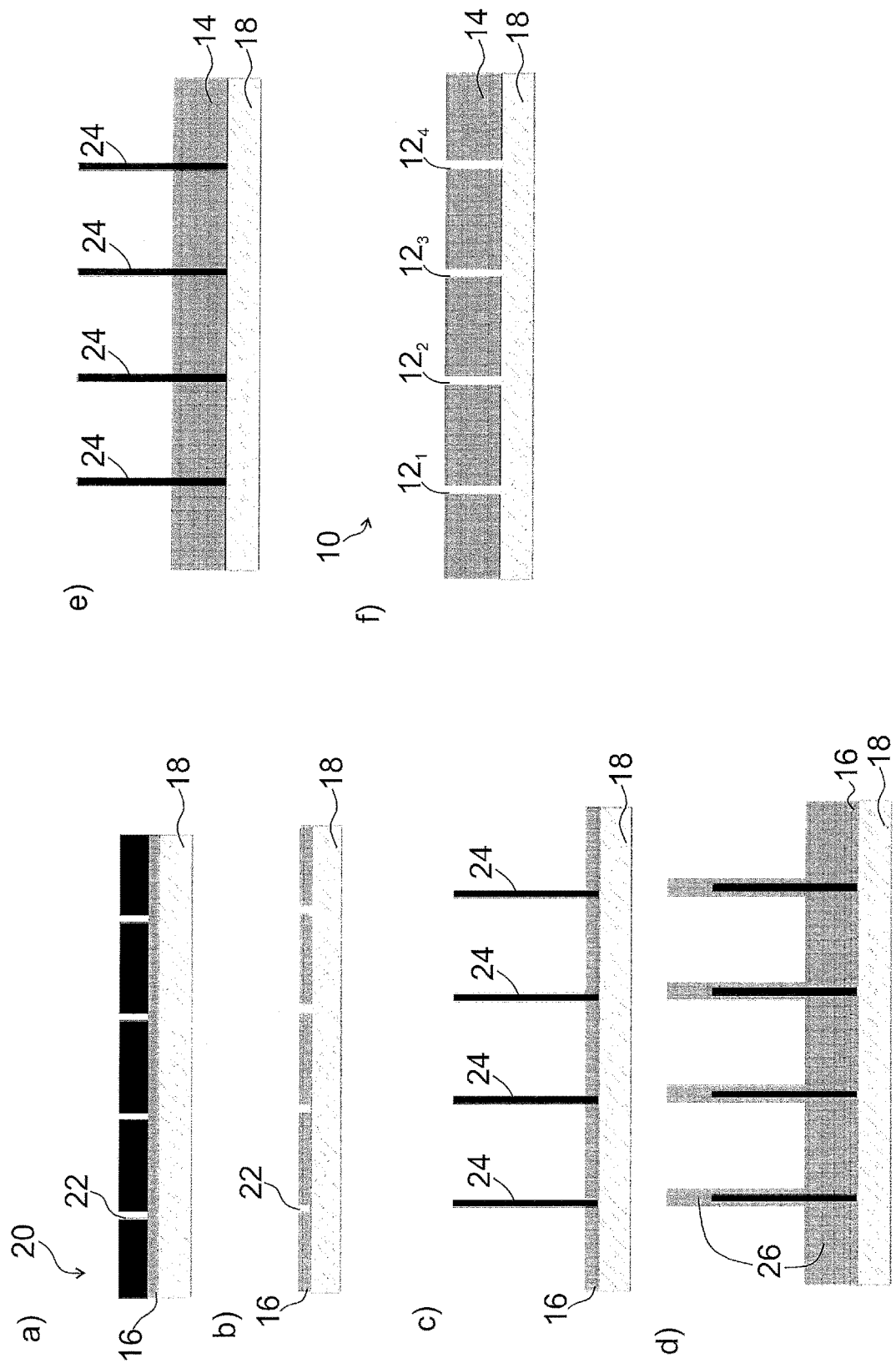
FIGS. 2a to 2f are schematic cross-sectional views illustrating the fabrication of apertures in the dielectric structure according to an example of the invention.

With reference to FIGS. 2 and 3, a configuration has been described in which thin holes $12_1$ to $12_4$ are formed in the dielectric layer 14, wherein the size and dimension of each of the holes $12_1$ to $12_4$ correspond to the dimensions of the corresponding nanowire 24. However, this is simply an example, and apertures of other sizes and shapes may be formed. For instance, in an example the sacrificial nanowire structures 24 may be grown on the substrate 18 in close spatial proximity, so that they merge and together form a nano wall. Upon removal of the nano wall from the substrate 18, the aperture corresponds to a deep and narrow trench formed in the dielectric layer 14.

The description and the drawings merely serve to illustrate the invention, but should not be understood to imply a limitation. The scope of the invention is determined by the appended claims.

REFERENCE SIGNS 10 hole pattern
$12_1$-$12_4$ holes of hole pattern 10
14 dielectric layer
16 dielectric mask layer
18 substrate
20 patterned resist layer
22 holes of patterned resist layer 20
24 sacrificial nanowire structures
26 dielectric layer deposit
28 nanowire laser array
30, $30_1$-$30_4$ nanowire laser structures of nanowire laser array 28
32 support element of nanowire laser structure 30, core
34 body element of nanowire laser structure 30, shell

What is claimed is:
1. A method for fabricating a nanostructure, comprising:
   growing a first nanowire on a substrate;
   forming a dielectric layer on said substrate, said dielectric layer surrounding said first nanowire, wherein a thickness of said dielectric layer is smaller than a length of said first nanowire; and removing said first nanowire from said dielectric layer, thereby exposing an aperture in said dielectric layer; and growing a second nanowire in said aperture on said substrate wherein growing said second nanowire comprises growing a support element in said aperture, and extending said support element above said dielectric layer, and growing a body element around at least a portion of said support element that extends above said dielectric layer.

2. The method according to claim 1, wherein growing said first nanowire on said substrate comprises:

forming a mask layer on said substrate;

forming an opening in said mask layer, wherein said opening extends to said substrate; and growing said first nanowire on said substrate in said opening.

3. The method according to claim 2, wherein said mask layer is formed at a thickness no larger than 80 nm.

4. The method according to claim 1, wherein said dielectric layer is formed on said substrate at a thickness of at least 100 nm.

5. The method according to claim 1, wherein a diameter of said body element is at least two times larger than a diameter of said support element.

6. The method according to claim 1, wherein said nanostructure is adapted to emit a laser signal at a wavelength $\lambda$, and a diameter of said support element is smaller than $\lambda/(2n)$, wherein n denotes an index of refraction of said support element.

7. The method according to claim 1, wherein said nanostructure is adapted to emit a laser signal at a wavelength $\lambda$, and a diameter of said body element is no smaller than $\lambda/n$, wherein n denotes an index of refraction of said body element.

8. The method according to claim 1, wherein growing said first nanowire comprises molecular beam epitaxy or metal organic chemical vapor deposition.

9. The method according to claim 1, wherein said first nanowire is grown in a direction perpendicular to an upper surface of said substrate.

10. The method according claim 1, wherein said first nanowire is grown at an angle inclined to a surface normal of said substrate.

11. The method according to claim 4, wherein said thickness of said dielectric layer is at least 150 nm.

12. The method according to claim 10, wherein said diameter of said body element is at least three times larger than said diameter of said support element.

13. The method according to claim 10, wherein said angle is at least 20 degrees.

14. A method for fabricating a nanostructure, comprising:

growing a first nanowire on a substrate;

forming a dielectric layer on said substrate, said dielectric layer surrounding said first nanowire, wherein a thickness of said dielectric layer is smaller than a length of said first nanowire; and removing said first nanowire from said dielectric layer, thereby exposing an aperture in said dielectric layer;

wherein said nanostructure is adapted to emit a laser signal at a wavelength $\lambda$, wherein a thickness of said dielectric layer is an integer multiple of $\lambda/(2n)$, wherein n denotes an index of refraction of said dielectric layer.

15. The method according to claim 14, wherein said dielectric layer is formed on said substrate at a thickness of at least 100 nm.

16. The method according to claim 15, wherein said thickness of said dielectric layer is at least 150 nm.

17. The method according to claim 14, further comprising a step of growing a second nanowire in said aperture on said substrate;

wherein growing said second nanowire comprises growing a support element in said aperture, and extending said support element above said dielectric layer, and growing a body element around at least a portion of said support element that extends above said dielectric layer.

18. The method according to claim 17, wherein a diameter of said body element is at least two times larger than a diameter of said support element.

19. The method according to claim 17, wherein said nanostructure is adapted to emit a laser signal at a wavelength $\lambda$, and a diameter of said support element is smaller than $\lambda/(2n)$, wherein n denotes an index of refraction of said support element.

20. The method according to claim 17, wherein said nanostructure is adapted to emit a laser signal at a wavelength $\lambda$, and a diameter of said body element is no smaller than $\lambda/n$, wherein n denotes an index of refraction of said body element.

* * * * *

UNITED STATES PATENT AND TRADEMARK OFFICE
CERTIFICATE OF CORRECTION

PATENT NO. : 10,511,151 B2
APPLICATION NO. : 15/759986
DATED : December 17, 2019
INVENTOR(S) : Gregor Koblmueller It is certified that error appears in the above-identified patent and that said Letters Patent is hereby corrected as shown below:

In the Claims

Claim 10, Column 9, Line 42, after "according" insert -- to --.
Claim 12, Column 10, Line 1, delete "claim 10," and insert -- claim 5, --.

Signed and Sealed this
Twelfth Day of May, 2020

Andrei Iancu
*Director of the United States Patent and Trademark Office*